United States Patent
Stephens et al.

[11] Patent Number: 5,901,173
[45] Date of Patent: May 4, 1999

[54] NOISE ESTIMATOR

[75] Inventors: Donald R. Stephens, Clearwater; William Mosley, Jr., Seminole, both of Fla.

[73] Assignee: Raytheon Company, Lexington, Mass.

[21] Appl. No.: 08/762,593

[22] Filed: Dec. 9, 1996

[51] Int. Cl.⁶ .............. H04B 17/00; H04L 27/08
[52] U.S. Cl. ............. 375/227; 375/345; 375/349; 455/67.3; 455/226.2
[58] Field of Search .............. 375/227, 345, 375/346, 321, 200, 344, 202, 349; 342/194, 400; 364/550; 455/226.1, 226.3

[56] References Cited

U.S. PATENT DOCUMENTS

| | | | |
|---|---|---|---|
| 3,879,664 | 4/1975 | Monsen . | |
| 4,048,566 | 9/1977 | Carson et al. | 325/329 |
| 4,101,839 | 7/1978 | Poole et al. . | |
| 4,360,929 | 11/1982 | Isobe . | |
| 4,637,066 | 1/1987 | Kennedy et al. . | |
| 4,811,423 | 3/1989 | Eastmond . | |
| 4,835,790 | 5/1989 | Yoshida et al. | 375/227 |
| 4,878,251 | 10/1989 | Richardson | 455/206 |
| 4,888,787 | 12/1989 | Kisak | 375/202 |
| 4,901,332 | 2/1990 | Williams et al. . | |
| 4,910,467 | 3/1990 | Leitch . | |
| 4,953,182 | 8/1990 | Chung . | |
| 5,083,304 | 1/1992 | Cahill . | |
| 5,261,004 | 11/1993 | Manlove et al. . | |
| 5,291,525 | 3/1994 | Funderburk et al. . | |
| 5,301,364 | 4/1994 | Arens et al. . | |
| 5,353,301 | 10/1994 | Mitzlaff | 375/200 |
| 5,483,691 | 1/1996 | Heck et al. . | |

FOREIGN PATENT DOCUMENTS

| | | |
|---|---|---|
| 0 588 206 A1 | 9/1993 | European Pat. Off. . |
| 58-68330 | 4/1983 | Japan ........ 375/227 |
| 640429 | 12/1978 | U.S.S.R. ...... 375/227 |
| PCT/US91/02587 | 4/1991 | WIPO ...... H04B 1/10 |

*Primary Examiner*—Amanda Le
*Attorney, Agent, or Firm*—Baker & Botts, L.L.P.

[57] ABSTRACT

A noise estimator for threshold correction of a receiver includes a low pass filter to remove wideband noise from an input signal that includes a signal component and a noise component. The output of the wideband filter is applied to a square-law power detector having an output applied to an envelope detector. The output of the envelope detector is the instantaneous envelope of the input signal and is applied to a low pass filter to perform time averaging and is also applied to a differential network. The output of the low pass filter is a signal representing a time averaged statistical envelope representing the statistical mean of the instantaneous envelope of the input signal. This signal is also applied to the differential network that generates a signal representing the difference in the instantaneous envelope of the input signal and the time averaged statistical envelope signal. This difference signal is applied to a square-law power detector and then to a low pass filter for time averaging. An output of the low pass filter is a signal representing an estimate of the noise component of the input signal.

8 Claims, 2 Drawing Sheets

NOISE ESTIMATOR

This invention relates to communication receivers and more particularly to synchronization of a digital receiver with a transmitter prior to data transmission.

BACKGROUND OF THE INVENTION

A basic radio communication system comprises, at a minimum, a transmitter and a receiver. The transmitter and receiver are interconnected by a radio frequency channel to permit transmission of an information signal therebetween. A digital receiver in a communication system will generally include an amplifier with a gain adjusted by a control signal. The process of adjusting the gain of an amplifier based on the received signal using a control signal is well-known as Automatic Gain Control (AGC).

Before data can be relayed from the transmitter to the receiver, the receiver or modem has to achieve synchronization with the transmitter. Prior to synchronization of the receiver with the frequency, phase and time variables of the received signal, the amplitude of the received signal at the receiver must first be determined. An automatic gain control circuit or algorithm sets the amplifier gain for optimum signal detection processing. If the amplifier gain is too low, then internal receiver noise may dominate and signal detection will be degraded. If the amplifier gain is too high, the analog circuit components of the receiver will saturate, causing nonlinearities, which also degrade performance. It is only after the gain levels have been correctly established that the receiver functions to estimate the other synchronization variables—that is, the frequency, phase and time variables. Synchronization of these variables is required before the receiver begins data demodulation and other signal processing functions.

In one prior art communications system utilizing quadrature modulation, a pilot carrier signal is transmitted in order to facilitate reception and decoding of transmitted information. This pilot signal is utilized for both amplitude and phase correction. Selective fading that occurs on a transmission path results in problems when attempting to use the pilot carrier signal. Where digital information is to be received in a synchronous manner, channel fading and noise can prevent the maintenance of synchronization.

Thus, there is a need for a communications system receiver operating at a specified probability of acquisition independent of the signal plus noise power calculation of the AGC circuit of the receiver.

The present invention relates to the synchronization of a receiver with a transmitter and, in particular to the correction of the threshold used for phaselock status in a digital receiver or modem. The receiver operates at a specified minimum probability of signal acquisition independent of the signal to noise power calculation of the Automatic Gain Control (AGC) circuit.

SUMMARY OF THE INVENTION

In accordance with the present invention, there is provided a noise estimator for threshold correction of phaselock in a receiver where a noise estimating circuit provides threshold correction of phaselock as a function of input noise power to mitigate a bias introduced by the AGC circuit at the output of a quadrature phase detector. The noise power estimator of the present invention utilizes the ergodic properties of the input signal and time averaging to arrive at a statistical average of input signal envelope. This time average of the input signal is subtracted from the instantaneous value of the detected envelope and the computed instantaneous error resulting from this subtraction is squared and time-averaged, resulting in an estimate of the input noise power.

In accordance with the present invention, there is provided a noise estimator for computing the noise estimate of an input signal where the input signal comprises a signal component and a noise component. The estimator circuit includes a filter for removing wideband noise from the input signal. Further, the noise estimator of the present invention includes a square-law power detector responsive to the output of the low pass filter and an envelope detector coupled to the output of the square-law power detector. A time-averaged envelope of the input signal is output from a low pass filter performing time averaging, and this output is applied to a subtractor that also receives the instantaneous value of the input envelope to generate an instantaneous error signal. This instantaneous error signal is squared and applied to a low pass filter that also performs time averaging. The resultant signal from the time averaging function is a noise estimate on the input signal. This noise estimate is then utilized for threshold correction for phaselock of a receiver to a transmitter.

BRIEF DESCRIPTION OF THE DRAWINGS

The invention will best be understood from the following description of embodiment thereof, given by way of example, in conjunction with the accompanying drawing. Referring to the drawing.

DETAILED DESCRIPTION

Figure 1:
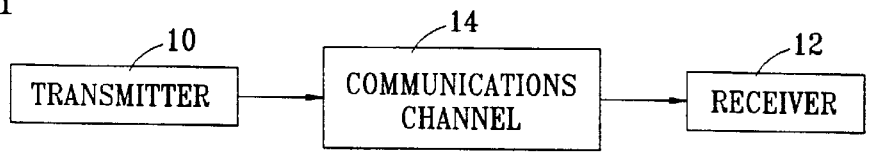
FIG. 1 is a block diagram of a basic communications system, including a transmitter and receiver, interconnected by a communications channel.

Referring to FIG. 1, the phaselock threshold correction apparatus of the present invention is utilized in a communication system, including a transmitter 10, a receiver 12 and a communications channel 14. Depending on the operating frequency of the transmitter 10 and the receiver 12, the communications channel is implemented, utilizing any one of many well-known communication links, operating either at a radio frequency or a microwave frequency. In the communications system of FIG. 1, the transmitter 10 sends a message s(t), which is a function of four variables, including transmitted amplitude, carrier frequency, transmitter time reference and transmitter phase reference. The send message s(t) is defined by the following expression:

$$s(t) = A(t) \cos(2\pi f t + \phi_m(t) + \Theta)$$

where:

A(t) is the transmitted amplitude, f is the carrier frequency, t is the transmitter time reference, $\phi_m(t)$ is the data message, and $\Theta$ is the transmitter phase reference.

At the receiver 12, a receive signal message r(t) is input to the receiver from the communications channel 14. The receive signal message r(t) is a function of the same four variables and is defined in accordance with the following expression:

$$r(t) = S(t+\tau) \cos(2\pi f(t+\tau) + \phi_m(t+\tau) + \Theta_r) + n(t)$$

Where:

S(t) is the received amplitude, f is the carrier frequency, t is the transmitter time reference, $\tau$ is the delay imposed by the communications channel and the receiver, $\phi_m(t)$ is the data message, $\Theta_r$ is the receiver phase reference, and n(t) is the channel and receiver noise.

Before data from the transmitter 10 can be processed by the receiver 12, the receiver must be synchronized with the transmitter. To achieve synchronization, the receiver must be synchronized with the frequency, phase and time variables of the send message S(t). However, prior to synchronization with the frequency, phase and time variables, the amplitude S(t) component of the received signal message, r(t), must be computed at the receiver 12.

For optimum signal detection and processing, an automatic gain control (AGC) circuit or an algorithm of the receiver 12 must set the amplifier gains. If the amplifier gains of the receiver 12 are set too low, then internal noise of the receiver may dominate the received signal and signal detection will be degraded. On the other hand, if the gains of the amplifiers of the receiver 12 are set too high, then the analog circuits within the receiver are subject to saturation, thereby causing nonlinearities with the result of degraded performance.

Following the setting of gains of the amplifiers of the receiver 12, other synchronization variables of the received signal r(t) may be estimated by circuits of the receiver. Synchronization of the receiver 12 to the various synchronization variables is required for the receiver to demodulate the data message, $\phi_m(t)$, and complete other signal processing functions. Synchronization of the receiver 12 to the transmitted message, s(t), will be, however, adversely affected by errors in the AGC circuit that set the gains of the amplifiers within the receiver 12.

Figure 2:
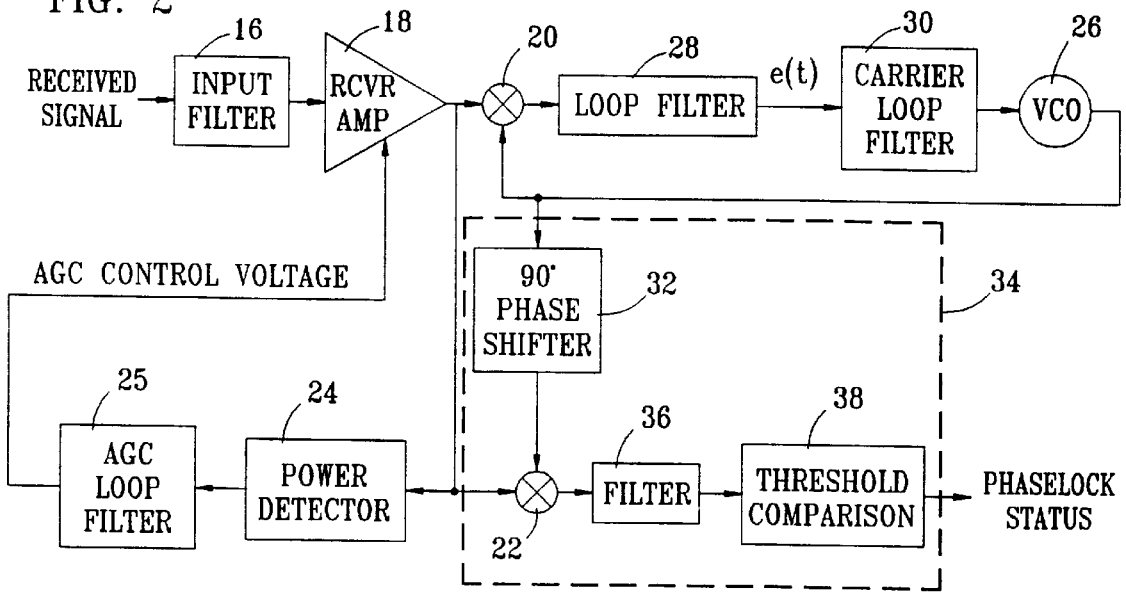
FIG. 2 is a partial block diagram of the receiver of FIG. 1, including a quadrature phase detector having a phaselock status output.

Referring to FIG. 2, there is shown a block diagram of that part of the receiver 12 for establishing phaselock status for synchronization with the transmitter 10. The four-variable received message signal r(t) is applied to the input of a filter 16 having an output applied to receiver amplifier(s) 18. Although only a single amplifier 18 is illustrated in the diagram, it should be understood that most receivers include several amplifiers for automatic gain control. As illustrated, an AGC control voltage is applied to the receiver amplifier 18 for conventional gain control of the amplifier. The gain controlled output of the amplifier 18 is applied to a mixer 20, a mixer 22 and a power detector 24—the latter is part of an AGC loop.

Also input to the mixer 20 is an output of a voltage control oscillator (VCO) 26 as part of the receiver phaselock status synchronization circuit. An output of mixer 20 is applied to a carrier loop filter 30, with the output of the loop filter 30 applied to the VCO 26.

The output of the VCO 26 is also applied to a 90° phase shifter 32 as part of a quadrature phase detector included within the dotted outline 34. An output of the phase shifter 32 is applied to the mixer 22 to be combined with the output of the amplifier 18. This combined signal from the mixer 22 is applied through a filter 36 to a threshold comparison network 38. An output of the threshold comparator 38 is a signal indicating phaselock status for frequency and phase variable synchronization of the receiver 12 with the transmitter message s(t). This is a particular implementation of a phaselock detector and it is understood that other configurations are possible.

Operation of the circuit of FIG. 2 for phaselock status will be explained, assuming a synchronization signal applied to the input filter 16 contains no data modulation. This enables a conventional phaselock loop (PLL) to synchronize the receiver 12 for frequency and phase. One of the conventional techniques using a phaselock loop for detecting phaselock utilizes a low pass filter receiving the error voltage e(t) from the mixer 20. The output of the low pass filter is applied to the VCO 26. Phaselock is identified if the error voltage is below an established threshold. This conventional technique for detecting phaselock is susceptible to false lock indications and noise.

The preferred technique for identifying phaselock status is utilization of the quadrature phase detector 34, sometimes identified as a coherent amplitude detector. The quadrature phase detector 34 correlates the received message signal r(t) output from the amplifier 18 with an output of the VCO 26 phase shifted 90° by the phase shifter 32. The phase shifted output of the VCO 26 and the output of the amplifier 18 are correlated in the mixer 22. The output voltage of the mixer 22 is proportional to $\cos(\theta_c)$, where $\theta_c$ is the phase error between the receiver 12 and the transmitter 10. As the phase error $\theta_c$, approaches zero, the quadrature phase detector 34 voltage at the output of the mixer 22 approaches a maximum voltage, thereby indicating phaselock loop synchronization. The output of the low pass filter 36 is then compared in the threshold comparator 38 for phaselock detection.

Figure 3:
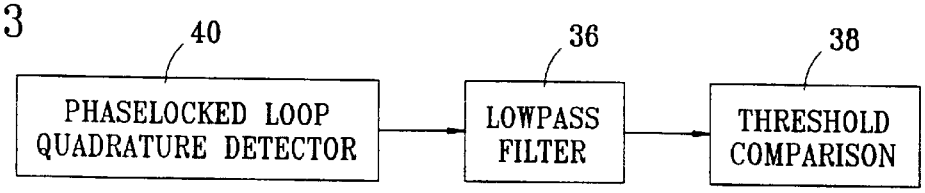
FIG. 3 is a basic flow diagram of a process for providing quadrature phase detection in threshold detection.

Referring to FIG. 3, there is shown the process for achieving phaselock status by operation of the quadrature phase detector 34. The mixer 22 correlates the received signal with the 90° phase shifted output of the VCO 26 in accordance with a low pass function, as given in block 40. As explained, the output of the mixer 22 is applied to the low pass filter 36, which responds to the output of the mixer 22 in accordance with a low pass function H(f). The voltage output of the low pass filter 36, varying in accordance with the function H(f), is utilized in the threshold comparator 38.

Figure 4:
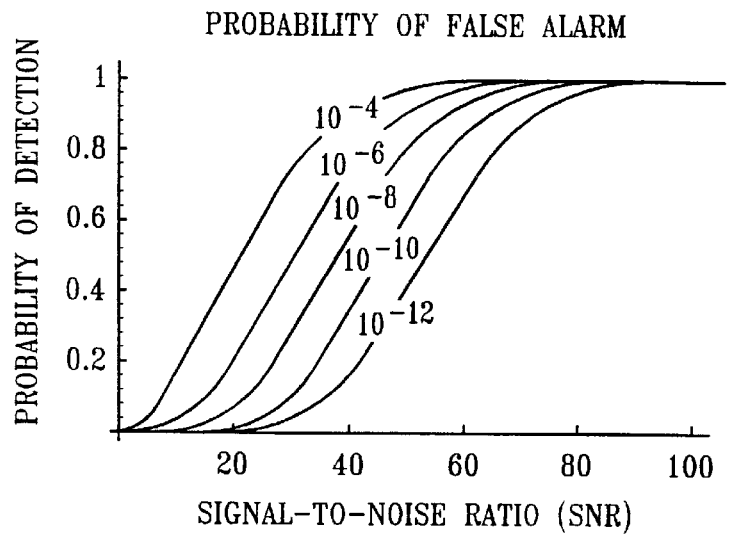
FIG. 4 illustrates receiver operating curves for use in determining probability of acquisition to select phaselock thresholds for the process of FIG. 3.

Referring to FIG. 4, there is shown a sequence of receiver operating curves for computation of the phaselock threshold voltage utilized in the threshold comparator 38. The curves of FIG. 4 illustrate the probability of detection of phaselock versus the probability of false alarm for each of the identified signals. To determine a threshold voltage for use in the threshold comparator 38, a probability of detection (declaration of phaselock) at a specific signal-to-noise ratio is specified. At the determined threshold setting, the probability of false alarm (false declaration of phaselock) is obtained from the curves of FIG. 4. The actual threshold voltage for the threshold comparator 38 is determined in accordance with the following equation:

$$P_{fa} = \frac{1}{\sqrt{2\pi}} \int_\lambda^\infty e^{-z^2/2} dz$$

where $$\lambda = \frac{V_{threshold}}{\sqrt{2E/N_0}}$$

By substituting the value of probability of false alarm (false acquisition), from FIG. 4 into this equation, the threshold voltage for the threshold comparator 38 is obtained through numerical analysis. Neglecting the time averaging of the filter 36 of FIG. 2, the quadrature phaselock voltage applied to the threshold comparator 38 is given by the equation:

$$V(t) = G \cos \Theta_c S(t)$$

where:

G is the gain of the amplifiers 18, $\Theta_c$ is the synchronization phase error, and S(t) is the amplitude of the received signal r(t).

This equation shows that the phaselock status of the receiver 12 is proportional to the gain of the amplifier 18. If the AGC loop of the receiver 12 establishes any error in setting the gain of the amplifier 18, the error will cascade to the synchronization circuits for carrier phase and clock timing.

In operation of the receiver of FIG. 2, the automatic gain control loop operates with unknown frequency and phase until synchronization of these variables is obtained. Due to channel and receiver noise n(t), the power detected by the automatic gain control loop of FIG. 2 includes the noise component, thereby yielding a sum of signal S(t) and noise n(t). The threshold voltage set into the threshold comparator 38, however, if selected from the curves of FIG. 4, does not include a noise component in the received signal. The noise component has the effect of adding a bias to the quadrature detector 34, causing the gain of the amplifier 18 to be artificially low for threshold setting. Therefore, from FIG. 4, the implication is that the receiver 12 will not achieve the desired probability of acquisition without a noise component correction.

Figure 5:
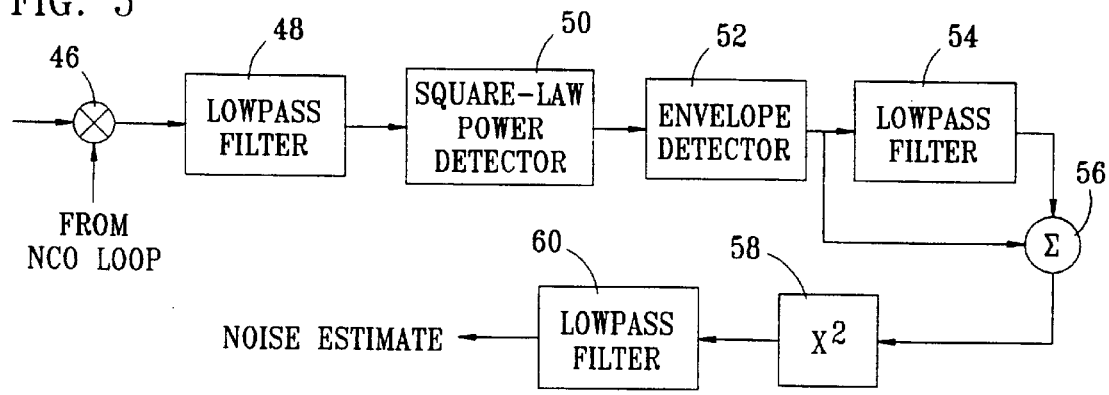
FIG. 5 is a block diagram of a noise power estimator for threshold correction of receiver phaselock in accordance with the present invention.

Referring to FIG. 5, there is shown a block diagram of a noise power estimator to enable operation of the receiver 12 at a specified probability of acquisition independent of the signal plus noise power calculation of the automatic gain control loop. The threshold voltage correction for the comparator 38 is a function of input noise power, which mitigates the bias introduced by the automatic gain control loop at the output of a quadrature phase detector 34.

With reference to FIG. 5, the received signal r(t) and a signal from a numerically controlled oscillator loop is applied to a complex mixer 46. An output of the complex mixer 46 is applied to a low pass filter 48 to remove wide-band noise from the received signal. The filtered output of the low pass filter 48 is applied to a square-law power detector 50, having an output applied to an envelope detector 52. Squaring the received signal in the square-law power detector 50 and taking the square root in the envelope detector 52 results in an output of the envelope detector 52 representing the envelope of the received signal plus a noise component. The output of the envelope detector 52 is applied to a low pass filter 54 to perform time averaging to obtain the statistical average of the envelope of the received signal. This statistical average output from the low pass filter 54 is input to a summer 56 that also receives an input from the envelope detector 52. In the summer 56 the instantaneous output from the envelope detector 52 is subtracted from the statistical average output from the low pass filter 54. The output of the summer 56 is squared in a square-law power detector 58 and then time averaged in a low pass filter 60. The output of the low pass filter 60 is an estimate of the input noise power, which enables adjustment of the threshold voltage in the threshold comparator 38 for a constant false alarm rate.

In accordance with the present invention, a quadrature detector 34 functions essentially as a waveform correlator. The phase threshold detection process, as illustrated in FIG. 3, compares the amplitude of a low-pass log-likelihood value against a threshold, and if the threshold is exceeded, then phaselock has been achieved.

Figure 6:
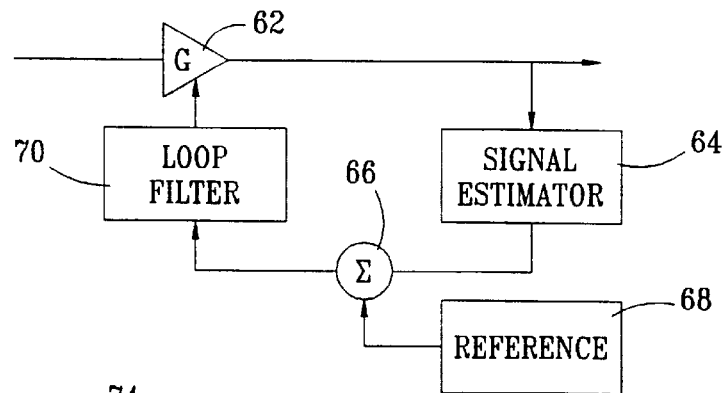
FIG. 6 is a block diagram of an automatic gain control correction circuit, including a signal estimator, in accordance with the present invention.

Referring to FIG. 6, there is shown a block diagram of the automatic gain control correction circuit for a receiver utilizing a noise power estimate as output from the noise estimator of FIG. 5. It should be understood that only the automatic gain control circuit of the receiver 12 is shown in FIG. 6, with the remaining elements of the receiver comprising conventional circuitry and not required for an understanding of the present invention. A received message r(t) that includes a signal component and a noise component is applied to a variable gain amplifier 62. An output of the amplifier 62 equates to the output of the amplifier 18 of FIG. 2. In addition to being applied to other circuits of a receiver, the output of the amplifier 62 is also applied to a signal estimator 64 that outputs a correction signal that represents an estimate of the noise component as computed by the threshold correction estimator of FIG. 7. This output is applied to a summer 66 that also receives a reference input from a source 68. An output of the summer 66 is applied to a loop filter 70 that generates an AGC control voltage applied to the amplifier 62.

Figure 7:
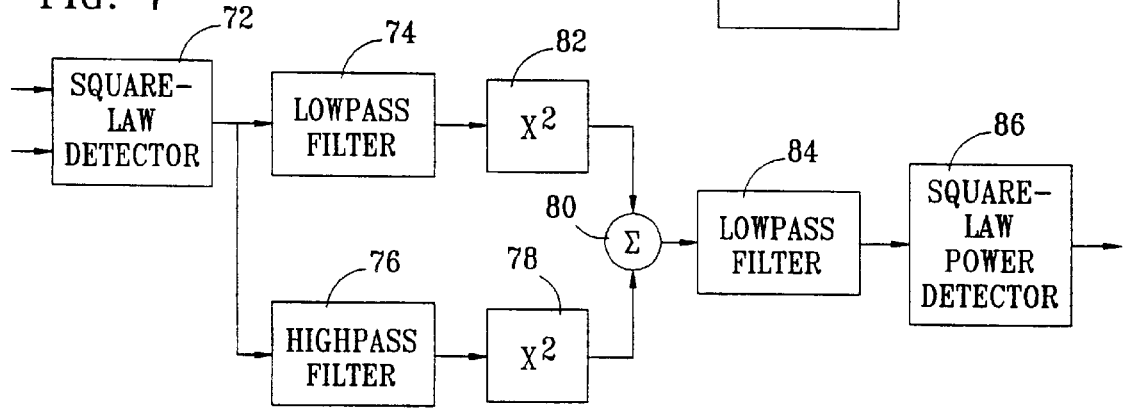
FIG. 7 is a block diagram of the signal estimator of the automatic gain control correction circuit of FIG. 6.

Referring to FIG. 7, there is shown a block diagram of the signal estimator 64 of FIG. 6. An output of the amplifier 62 is applied to an envelope detector 72 that outputs a signal representing the envelope of the input signal plus a noise component. This output of the envelope detector 72 is applied to a low pass filter 74 and a high pass filter 76. An output of the high pass filter 76 represents the envelope of the noise component, and this signal is applied to a square-law power detector 78 that generates an output to a summer 80. Also applied to the summer 80 is an output of a square-law power detector 82 that squares the output of the low pass filter 74. An output of the summer 80 is applied to a low pass filter 84 that provides an input to an envelope detector 86. An output of the envelope detector 86 represents the output of the signal estimator 64 of FIG. 6.

Although preferred and alternative embodiments of the present invention have been illustrated in the accompanying drawings and described in the foregoing Detailed Description, it will be understood that the invention is not limited to the embodiments disclosed, but is capable of numerous rearrangements, modifications and substitutions of parts and elements without departing from the spirit of the invention.

We claim:

1. A noise estimator circuit for determining noise power of a receiver input signal where the receiver input signal includes a noise component and a signal component, comprising:

a square-law power detector responsive to the receiver input signal and having an output;

a square root detector connected to receive the output of the square-law power detector and having an output representing an instantaneous envelope of the input signal;

means for generating a time averaged statistical envelope signal representing the statistical mean of the instantaneous envelope of the input signal;

means for generating a difference signal representing the difference between the instantaneous envelope of the input signal and the time averaged statistical envelope signal; and means for converting the difference signal into a time averaged estimate of the input noise power.

2. A noise estimator circuit as set forth in claim 1 including means for filtering the receiver input signal to remove wideband noise prior to application to said square-law power detector.

3. A noise estimator circuit as set forth in claim 2 wherein said means for filtering includes a low pass filter.

4. A noise estimator circuit as set forth in claim 1 wherein said means for generating a time averaged statistically envelope signal comprises a low pass filter.

5. A noise estimator circuit for determining noise power of a receiver input signal where the receiver input signal includes a noise component and a signal component comprising:

a square-law power detector responsive to the receiver input signal and having an output;

a square root detector connected to receive the output of the square-law power detector and having an output representing an instantaneous envelope of the input signal;

means for generating a time averaged statistical envelope signal representing the statistical mean of the instantaneous envelope of the input signal;

means for generating a difference signal representing the difference between the instantaneous envelope of the input signal and the time averaged statistical envelope signal;

a square-law power detector connected to receive the difference signal and having an output; and a low pass filter connected to receive the output of said square-law power detector and having an output representing the time averaged estimate of the input noise power.

6. A signal estimator for an automatic gain control loop of a communications receiver, comprising:

a low pass filter connected to receive an input signal to the communications receiver and having a filtered output;

a square-law detector connected to receive the output of the low pass filter and having an output representing the instantaneous envelope of the input signal;

means for converting the input signal to the communications receiver to an instantaneous envelope of the noise component of the input signal;

means for generating a difference power signal representing the difference between the instantaneous envelope signal of the input signal and the noise component of the input signal; and means for converting the difference signal into the noise component of the input signal to the receiver.

7. A signal estimator for an automatic gain control loop of communications receiver, comprising:

means for converting an input signal to the communications receiver into an instantaneous envelope of the input signal;

a high pass filter connected to receive the input signal to the communications receiver and having a filtered output signal;

a square-law detector connected to receive the output of the high pass filter and having an output representing an instantaneous envelope of the noise component of the input signal;

means for generating a difference power signal representing the difference between the instantaneous envelope signal of the input signal and the noise component of the input signal; and means for converting the difference signal into the noise component of the input signal to the receiver.

8. A signal noise estimator as set forth in claim 7 wherein said means for converting the difference signal comprises a low pass filter, and a square-law detector responsive to the output of the low pass filter and generating the estimate of the signal component of the input signal.

* * * * *